(12) United States Patent
Mulbrook

(10) Patent No.: US 6,954,774 B1
(45) Date of Patent: Oct. 11, 2005

(54) BANDPASS FILTER WITH ABILITY TO TUNE A PASS FREQUENCY, PASSBAND GAIN AND FILTER Q

(75) Inventor: Mark M. Mulbrook, Marion, IA (US)

(73) Assignee: Rockwell Collins, Cedar Rapids, IA (US)

( * ) Notice: Subject to any disclaimer, the term of this patent is extended or adjusted under 35 U.S.C. 154(b) by 623 days.

(21) Appl. No.: 10/027,402

(22) Filed: Dec. 20, 2001

(51) Int. Cl.[7] .............................................. G08G 7/02

(52) U.S. Cl. ....................................... 708/819

(58) Field of Search ......................... 708/819

(56) References Cited

U.S. PATENT DOCUMENTS

| | | | | |
|---|---|---|---|---|
| 4,965,853 A | * | 10/1990 | Barnard ...................... | 455/209 |
| 5,375,146 A | * | 12/1994 | Chalmers .................... | 375/350 |
| 5,440,264 A | * | 8/1995 | Sevenhans et al. ......... | 327/553 |
| 5,960,091 A | * | 9/1999 | White et al. ................. | 381/98 |

* cited by examiner

*Primary Examiner*—Tan V. Mai
(74) *Attorney, Agent, or Firm*—Nathan O. Jensen; Kyle Eppele

(57) ABSTRACT

A bandpass filter which has a tunable passband frequency and independently controllable Q and passband gain, where the filter employs a separate passband gain control which is summed with a gain loop controlling the Q of the filter.

14 Claims, 1 Drawing Sheet

BANDPASS FILTER WITH ABILITY TO TUNE A PASS FREQUENCY, PASSBAND GAIN AND FILTER Q

FIELD OF THE INVENTION

The present invention generally relates to bandpass filters, and more particularly relates to passband frequency tunable bandpass filters with independent control of the passband tune frequency, Q and gain.

BACKGROUND OF THE INVENTION

In past years, tunable bandpass filters have been available which provide high Qs. Typically, these filters will have a large gain associated with maintaining the high Q.

While these filters have been widely understood, their application is at least somewhat limited. For example, in certain tunable bandpass filters, it has been necessary to attenuate the incoming signal because of the high gain that is normally associated with maintaining high Q. This attenuation of the incoming signal creates problems of its own, such as a less desirable signal to noise ratio.

Consequently, there exists a need for improved methods and systems for tuning a variable high Q bandpass filter while maintaining desirable gain levels and S/N ratios in an efficient manner.

SUMMARY OF THE INVENTION

It is an object of the present invention to provide a system and method for tuning a frequency of a bandpass filter with independently variable Q and gain.

It is a feature of the present invention to utilize separate and independent controls for the Q of the filter and for gain in the filter passband.

It is an advantage of the present invention to achieve improved performance with tunable bandpass filters.

It is another advantage of the present invention to achieve tunability of the filter without the need for changing more than one transfer function.

The present invention is an apparatus and method for controlling tunable bandpass filters, designed to satisfy the aforementioned needs, provide the previously stated objects, include the above-listed features, and achieve the already articulated advantages. The present invention is carried out in an "unwanted passband gain-less" manner in a sense that the passband gain can be independently controlled so as not to be linked to a variable Q of the bandpass filter.

Accordingly, the present invention is a tunable bandpass filter system and method including independent controls for passband gain, Q, and passband frequency.

BRIEF DESCRIPTION OF THE DRAWINGS

The invention may be more fully understood by reading the following description of the preferred embodiments of the invention, in conjunction with the appended drawings wherein.

DETAILED DESCRIPTION

Figure 1:
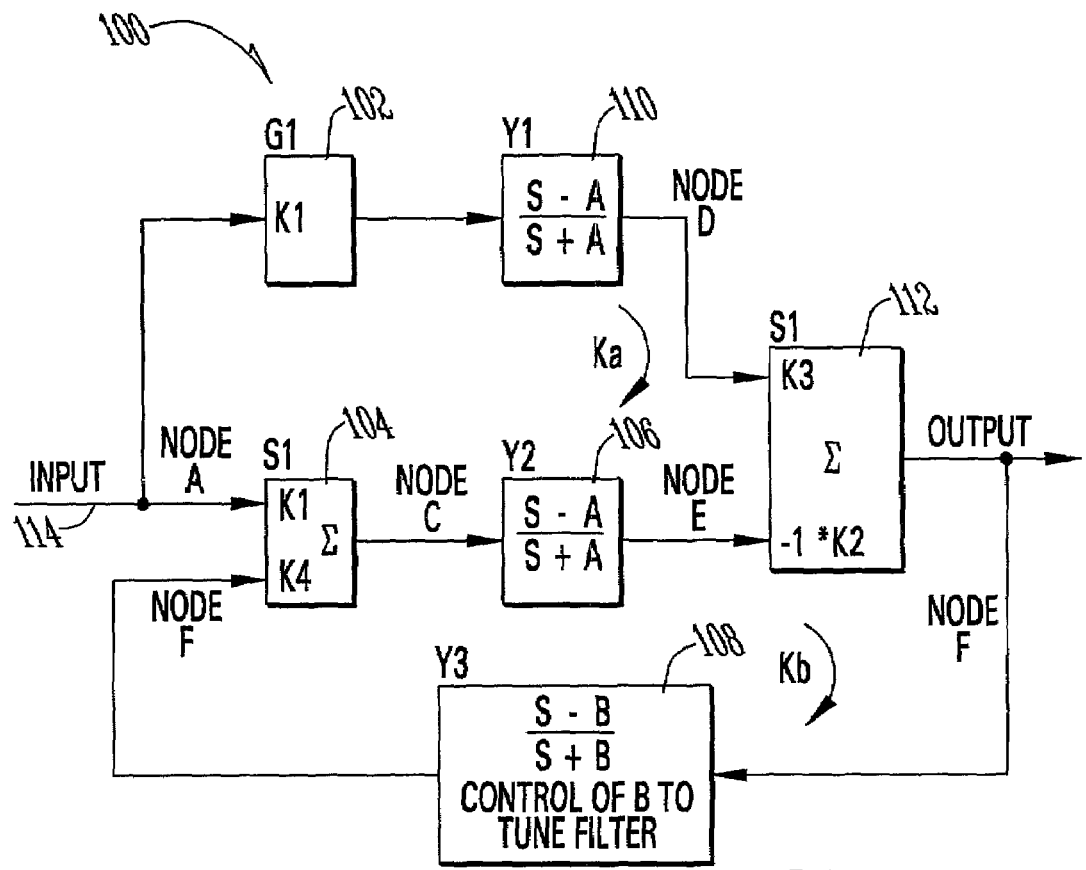
FIG. 1 is a block diagram view of a filter topology of a filter system of the present invention.

Now referring to FIG. 1, there is shown a passband frequency tunable bandpass filter system of the present invention generally designated 100, which shows three main transfer function blocks 106, 108 and 110.

Passband frequency tuning block 108 is a frequency tunable RC all pass structure which preferably uses an R control input with 10 bits to tune the resistance R and a C control input with 8 bits to tune the capacitance C. The controls for R and C, respectively, control B in the transfer function:

(S−B)/(S+B)

In a preferred embodiment of the present invention, block 108 provides the ability to have a bandpass filter with a passband which is tunable across a wide range of frequencies, such as from 2 MHz to 450 MHz.

Loop Kb sets the Q of the filter 100. Loop Kb consists of a gain summation block 104, transfer function block 106 (S−A)/(S+A), gain summation block 112, and passband frequency tuning block 108. In a preferred embodiment of the present invention, the Q of the filter 100 could be controlled from 5 to 300. The Q of the filter 100 is preferably controlled by a Q control, which is a 10-bit gain control for loop Kb.

Loop Ka, which consists of gain summation block 102 (which in a preferred embodiment may be identical to block 104), transfer function 110 (S−A)/(S+A), and gain summation block 112, controls the gain of the filter 100 in the passband tuned by block 108. The control is accomplished by passband gain control, which may be a 10-bit control of the gain for loop Ka. In a preferred embodiment of the present invention, the bandpass gain may be controllable from 0 dB to 60 dB.

The present invention may be best implemented using the following formula:

$$Y = \left[\frac{K_3 - K_1 K_2}{1 + K_4 K_2}\right]\left[\left[\frac{S(B-A)}{S^2 + S(A+B)\left[\frac{1-K_4 K_2}{1+K_4 K_2}\right] + (A \cdot B)}\right] + \left[\frac{S^2 - (A \cdot B)}{S^2 + S(A+B)\left[\frac{1-K_4 K_2}{1+K_4 K_2}\right] + A \cdot B}\right]\right]$$

Where:
$S = j\omega$
K1 is the gain from Node A to the output of the blocks G1 and S1.
K4 is the gain from Node F to the output of the block S1, Node C.
K3 is the gain from Node D to the output of the block S1, the Output.
K2 is the gain from Node E to the output of the block S1, the Output.

In the block diagram, bock S1 represents the summation of the voltages at Node A with gain K1 and Node F with the gain of K4. Block S1 represents the summation of the voltages at Node E with the gain of −K2 and Node D with the gain K3. Y1, Y2 are allpass filters, with the transfer functions of (S−A)/(S+A). Y3 is an allpass filter, with the transfer functions of (S−B)/(S+B). The value for A and B represent a value that is not dependent on the frequency. In many cases, the values for A and B will be determined by the function 1/RC, which is based upon the topology of the allpass filter. The topology of the allpass filter structure can take on many different forms to realize the same transfer function. The block S1 could also be represented as gain blocks for K1 and K4 followed by a summation network. Block S2 could also be represented as gain blocks for K3 and −1*K2 followed by a summation network. The gain and summation functions can be achieved with many different circuit topologies.

Throughout this description, no reference is made to the hardware implementation of this bandpass filter, because it is believed that the beneficial aspects of the present invention would be achievable with various implementation schemes. For example, the entire filter 100 could be performed by an ASIC; a circuit card with discrete components could be used and preferred in certain applications; it is also conceivable that a very high power general-purpose digital computer could execute software which performs the filter functions on a digital signal.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

I claim:

1. A filter comprising:
   a passband frequency tuning control which is configured to vary a passband;
   a Q control gain loop coupled with said tuning control to provide variable Q;
   a passband gain control, where said passband gain control is independent of control of said Q control; and,
   a gain summation function coupled between said Q control gain loop and said passband gain control.

2. A filter of claim 1 wherein said passband frequency tuning control is an RC allpass filter.

3. A filter of claim 2 wherein said RC filter has a resistance control input and a capacitance control input.

4. A filter of claim 3 wherein said resistance control input uses a multiple bit resistance control input.

5. A filter of claim 1 wherein said Q control gain loop is controlled by a multiple bit gain/Q control input.

6. A filter of claim 5 wherein said passband gain control is controlled by a multiple bit passband gain control input which is independent of said multiple bit gain/Q control input.

7. A filter of claim 6 wherein said multiple bit gain/Q control input and said multiple bit passband gain control are inputs to said gain summation function.

8. A filter of claim 1 wherein:
   said passband gain control includes an initial passband control summer and a passband transfer function operator; and,
   said Q control gain loop includes an initial Q control summer and a Q control transfer function operator.

9. A filter of claim 8 wherein said initial passband control summer and said initial Q control summer are identical.

10. A filter of claim 8 wherein said passband transfer function operator and said Q control transfer function operator each perform an (S−A)/(S+A) transfer function; where S=jω and A=1/RC.

11. A filter of claim 10 wherein said passband frequency tuning control performs a transfer function of (S−B)/(S+B) wherein B=1/RC.

12. A filter of claim 1 wherein said passband frequency tuning control utilizes a transfer function of:

$$Y = \left[\frac{K_3 - K_1 K_2}{1 + K_4 K_2}\right]\left[\left[\frac{S(B-A)}{S^2 + S(A+B)\left[\frac{1-K_4 K_2}{1+K_4 K_2}\right] + (A \cdot B)}\right] + \left[\frac{S^2 - (A \cdot B)}{S^2 + S(A+B)\left[\frac{1-K_4 K_2}{1+K_4 K_2}\right] + A \cdot B}\right]\right]$$

Where:
   S=jω
   K1 is a gain from a first node to an output of a first block and a second block;
   K4 is a gain from a second node to an output of said second block, which is a third node;
   K3 is a gain from a fourth node to an output of the second block;
   K2 is a gain from a fifth node to an output of the second block.

13. A filter comprising:
   means for tuning a filter to a passband frequency;
   means for controlling Q via controlling a gain;
   means for manipulating a gain in said passband frequency; and
   wherein said means for controlling and said means for manipulating are independent.

14. A bandpass filter of claim 13 wherein said means for tuning a passband frequency utilizes a transfer function of:

$$Y = \left[\frac{K_3 - K_1 K_2}{1 + K_4 K_2}\right]\left[\left[\frac{S(B-A)}{S^2 + S(A+B)\left[\frac{1-K_4 K_2}{1+K_4 K_2}\right] + (A \cdot B)}\right] + \left[\frac{S^2 - (A \cdot B)}{S^2 + S(A+B)\left[\frac{1-K_4 K_2}{1+K_4 K_2}\right] + A \cdot B}\right]\right]$$

Where:
   S=jω
   K1 is a gain from a first node to an output of a first block and a second block;
   K4 is a gain from a second node to an output of said second block, which is a third node;
   K3 is a gain from a fourth node to an output of the second block;
   K2 is a gain from a fifth node to an output of the second block.

* * * * *